United States Patent
Shi et al.

(10) Patent No.: US 10,745,589 B2
(45) Date of Patent: Aug. 18, 2020

(54) CHEMICAL MECHANICAL POLISHING (CMP) OF COBALT-CONTAINING SUBSTRATE

(71) Applicant: Versum Materials US, LLC, Allentown, PA (US)

(72) Inventors: Xiaobo Shi, Chandler, AZ (US); Joseph Rose, Chandler, AZ (US); Timothy Joseph Clore, Chandler, AZ (US); James Allen Schlueter, Phoenix, AZ (US); Malcolm Grief, Phoenix, AZ (US); Mark Leonard O'Neill, Queen Creek, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 15/615,236

(22) Filed: Jun. 6, 2017

(65) Prior Publication Data
US 2017/0362466 A1 Dec. 21, 2017

Related U.S. Application Data

(60) Provisional application No. 62/350,844, filed on Jun. 16, 2016.

(51) Int. Cl.
*C09G 1/02* (2006.01)
*B24B 37/04* (2012.01)
(Continued)

(52) U.S. Cl.
CPC ............. *C09G 1/02* (2013.01); *B24B 37/044* (2013.01); *C09K 3/1409* (2013.01); *C23F 3/04* (2013.01);
(Continued)

(58) Field of Classification Search
CPC ... C09G 1/02; H01L 21/3212; H01L 21/7684; H01L 21/30625; B24B 37/044;
(Continued)

(56) References Cited

U.S. PATENT DOCUMENTS

2009/0053896 A1* 2/2009 Hu ........................ C09G 1/02
438/693
2013/0140273 A1 6/2013 Lu et al.
(Continued)

FOREIGN PATENT DOCUMENTS

TW 201610046 A 3/2016

OTHER PUBLICATIONS

Stöckgen et al. (Integration Challenges for Copper Damascene Electroplating. ECS Transactions, 25 (38) 3-17 (2010), The Electrochemical Society (15 pages)). Used Only as Evidence. (Year: 2010).*

(Continued)

*Primary Examiner* — Duy Vu N Deo
*Assistant Examiner* — Mahmoud Dahimene
(74) *Attorney, Agent, or Firm* — Lina Yang

(57) ABSTRACT

Chemical mechanical polishing (CMP) compositions, methods and systems for polish cobalt or cobalt-containing substrates are provided. The CMP compositions comprise α-alanine, abrasive particles, a salt of phosphate, corrosion inhibitor, oxidizer and water. The cobalt chemical mechanical polishing compositions provide high removal rate of Co as well as very high selectivity of Co film vs. dielectric film, such as TEOS, SixNy (with 1.0<x<3.0, 1.33<y<4.0), low-k, and ultra low-k films.

19 Claims, 1 Drawing Sheet

(51) Int. Cl.
*C09K 3/14* (2006.01)
*C23F 3/04* (2006.01)
*H01L 21/321* (2006.01)
*H01L 21/768* (2006.01)

(52) U.S. Cl.
CPC ...... *H01L 21/3212* (2013.01); *H01L 21/7684* (2013.01)

(58) Field of Classification Search
CPC ....... B24B 37/04; B24B 57/02; C09K 3/1409; C23F 3/04
See application file for complete search history.

(56) References Cited

U.S. PATENT DOCUMENTS

| | | |
|---|---|---|
| 2013/0186850 A1 | 7/2013 | Wang et al. |
| 2015/0004788 A1* | 1/2015 | Shi .................... H01L 21/30625 438/693 |
| 2016/0027657 A1* | 1/2016 | Shi .................... H01L 21/31111 438/693 |
| 2016/0108286 A1 | 4/2016 | Sikma et al. |

OTHER PUBLICATIONS

Nishizawa, Hideak, et al., "Fundamental Study of Chemical-Mechanical Polishing Slurry of Cobalt Barrier Metal for Next-Generation Interconnect Process", Jpn. J. Appl. Phys., vol. 49, 05FC03 (2 pages), 2010.

Lu, Hai-Sheng, et al., "The Effect of H2O2 and 2-MT on the Chemical Mechanical Polishing of Cobalt Adhesion Layer in Acid Slurry," Electrochem. And Solid-State Letters, vol. 15, Issue 4, pp. H97-H100 (2012).

Peethaia, B. C., et al., Cobalt Polishing with Reduced Galvanic Corrosion at Copper/Cobalt Interface Using Hydrogen Peroxide as a Oxidizer in Colloidal Silica-Based Slurry, Journal of the Electrochemical Society, vol. 159, Issue 6, pp. H582-H588 (2012).

* cited by examiner

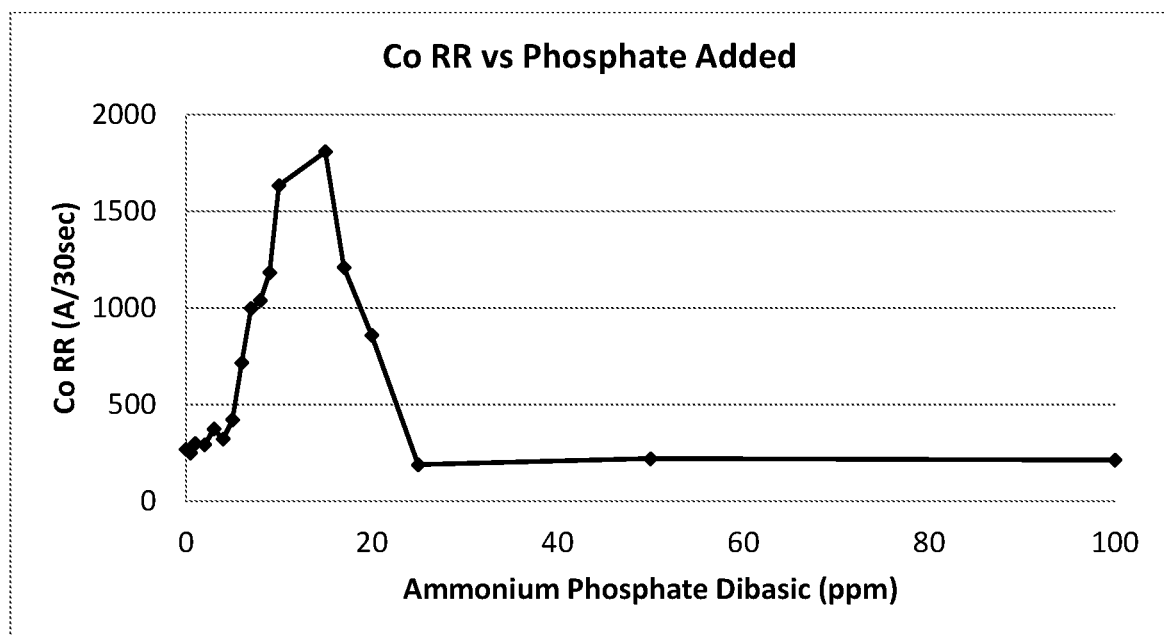

CHEMICAL MECHANICAL POLISHING (CMP) OF COBALT-CONTAINING SUBSTRATE

CROSS REFERENCE TO RELATED PATENT APPLICATIONS

The present patent application claims the benefit of U.S. Provisional Patent Application Ser. No. 62/350,844 filed Jun. 16, 2016.

BACKGROUND OF THE INVENTION

The present invention relates generally to chemical mechanical polishing (CMP) of semiconductor substrates.

As industry standards trend toward smaller device features, there is a continuous developing need for new types of metal materials that can be used to replace tungsten (W) or copper (Cu) as new electrical conducting interconnection materials in IC chip fabrication and integration, specifically, for 16 nm technology nodes and beyond applications. Cobalt (Co) has been considered and tested as one of the promising new type of metal interconnection material in IC chip integration. CMP of cobalt interconnect requires polishing of cobalt layer at high removal rates and provide high degree of planarity without introducing corrosion defects. Cobalt interconnect polishing requires removal rates in excess of 1000 Angstroms/minute (>1000 Å/min), which requires slurry compositions which are chemically aggressive to cobalt and yet not cause any corrosion issues.

Unfortunately, existing slurries for polishing of copper or tungsten cannot be used to give satisfactory CMP performance for cobalt interconnect structures. Without being limited to any theory, this may be due to cobalt being chemically reactive with the existing polishing slurries, resulting in cobalt dissolution, which in turn leads to a high defect count.

Most of the prior art on cobalt CMP relates to polishing thin cobalt barrier liners underneath the copper interconnects. The requirement of cobalt barrier polishing is quite different from cobalt interconnect polishing. Cobalt barrier polish requires cobalt removal rates typically less than 500 Angstroms/min (<500 Å/min).

US Patent Applications 2016108286, 20130186850 teach slurry compositions for chemical mechanical polishing of a cobalt interconnect or a cobalt barrier layer.

US Patent Application 20130140273 teaches slurry for chemical mechanical polishing of Co. The slurry comprises components by weight as follows, inhibitor 0.01-2%, oxidant 0-5%, abrasive 0.1-10%, complexing agent 0.001-10%, and the rest of water. The pH value of the slurries is adjusted to 3-5 by a pH value adjustor. The inhibitor is chosen from one or more kinds of five-membered heterocycle compound containing S and N atoms or containing S or N atom. The oxidant is one or more chosen from $H_2O_2$, $(NH_4)_2S_2O_8$, $KIO_4$, and $KClO_5$. The abrasive is one or more chosen from $SiO_2$, $CeO_2$, and $Al_2O_3$. The complexing agent is one or more chosen from amino acid and citric acid. The slurry can effectively prevent Co over corrosion and reduce the polishing rate of Co in the polishing process.

"Fundamental Study of Chemical-Mechanical Polishing Slurry of Cobalt Barrier Metal for Next-Generation Interconnect Process," Hideak Nishizawa et al., Jpn. J. Appl. Phys., Vol. 49, 05FC03 (2 pages), 2010 show that in slurries with pH 10, a passivation layer is formed on cobalt surface and cobalt-copper galvanic corrosion is minimized.

"The Effect of H2O2 and 2-MT on the Chemical Mechanical Polishing of Cobalt Adhesion Layer in Acid Slurry," Hai-Sheng Lu et al., Electrochem. and Solid-State Letters, Vol. 15, Issue 4, pp. H97-H100 (2012) demonstrates that $H_2O_2$ greatly increases the static etch rate (SER) and removal rate (RR) of cobalt. The 2-Mercaptothiazoline (2-MT) is very efficient at inhibiting cobalt corrosion and reducing the SER and RR of cobalt in the acid slurry. In the glycine based slurry at pH=5, by using 2-MT, the corrosion potential difference between Co and Cu can be reduced to a very small value.

"Cobalt Polishing with Reduced Galvanic Corrosion at Copper/Cobalt Interface Using Hydrogen Peroxide as an Oxidizer in Colloidal Silica-Based Slurries," B. C. Peethala et al., Journal of the Electrochemical Society, Vol. 159, Issue 6, pp. H582-H588 (2012) used colloidal silica-based slurry with 1 wt. % $H_2O_2$ as the oxidizer and 0.5 wt % arginine as the complexing agent for CMP on cobalt; this slurry showed superior performance (better post-polish surface quality and no pit formation) at pH 10 compared to pH 6 and 8. At pH 10, there is no measurable dissolution of Co and an open circuit potential ($E_{oc}$) difference of about 20 mV between Cu and Co, suggestive of reduced galvanic corrosion. The results also suggest that, during polishing, the Co film surface was covered with a passive film, possibly of Co (III) oxides. Addition of 5 mM BTA to this slurry inhibited Cu dissolution rates and yielded a Co/Cu removal rate ratio of about 1.2 while further reducing the $E_{oc}$ difference between Cu and Co to about 10 mV, both very desirable attributes.

Thus, there is a strong need for the development of innovative Co CMP polishing compositions that can provide high, tunable Co film removal rates, low Co film static etch rates, low barrier film and dielectric film removal rates, high and desirable selectivity of Co vs. barrier films and Co vs. dielectric films, and minimize or eliminate the possible galvanic corrosion at Co/Cu interface.

BRIEF SUMMARY OF THE INVENTION

The needs are satisfied by using the disclosed compositions, methods, and planarization systems for CMP of cobalt-containing substrate.

In one aspect, CMP polishing compositions are provided for CMP of cobalt-containing substrate. The CMP polishing composition comprises:

an abrasive;
alanine comprising α-amino group;
phosphate compound comprising $H_2PO_4^{1-}$, $HPO_4^{2-}$, or $PO_4^{3-}$;
corrosion inhibitor;
oxidizer;
water; and
optionally
an amine compound;
a chelating agent;
a pH adjusting agent;
biocide; and
a surfactant;
wherein the chemical mechanical polishing (CMP) polishing composition having a pH from 2.0 to about 12; preferably from 6.0 to 10.0; and more preferably from 7.0 to 9.0; most preferably from 7.5 to 8.5.

In another aspect, a method of using the Co CMP polishing composition is provided for CMP of cobalt-containing substrate. The method comprises steps of:

a) providing a semiconductor substrate having a surface containing a first material and at least one second material;
b) wherein the first material is Co and the second material is selected from the group consisting of dielectric film, low-k and ultra low-k film, and barrier film;
c) providing a polishing pad;
d) providing a chemical mechanical polishing composition comprises:
   an abrasive;
   alanine comprising α-amino group;
   phosphate compound comprising $H_2PO_4^{1-}$, $HPO_4^{2-}$, or $PO_4^{3-}$;
   corrosion inhibitor;
   oxidizer;
   water; and
   optionally
   an amine compound;
   a chelating agent;
   a pH adjusting agent;
   biocide; and
   a surfactant;
   wherein the chemical mechanical polishing (CMP) polishing composition having a pH from 2.0 to about 12; preferably from 6.0 to 10.0; and more preferably from 7.0 to 9.0; most preferably from 7.5 to 8.5; and
e) polishing the surface of the semiconductor substrate to selectively remove the first material;
   wherein at least a portion of the surface is in contact with both the polishing pad and the chemical mechanical polishing composition; and ratio of removal rate of the first material to removal rate of the second material is equal or greater than 1; preferably 10, more preferably greater than 50, and most preferably greater than 100.

In yet another aspect, a CMP system is provided for CMP of cobalt-containing substrate. The CMP system comprises:
   a semiconductor substrate having a surface containing a first material and at least one second material;
   wherein the first material is Co and the second material is selected from the group consisting of dielectric films (such as TEOS, SixNy (with 1.0<x<3.0, 1.33<y<4.0), low-k and ultra low-k films, and barrier films (such as Ta, TaN, Ti, and TiN films);
   a polishing pad; and
   a chemical mechanical polishing composition comprises:
      an abrasive;
      alanine comprising α-amino group;
      phosphate compound comprising $PO_4^{3-}$;
      corrosion inhibitor;
      oxidizer;
      water; and
      optionally
      an amine compound;
      a chelating agent;
      a pH adjusting agent;
      biocide; and
      a surfactant;
      wherein the chemical mechanical polishing (CMP) polishing composition having a pH from 2.0 to about 12; preferably from 6.0 to 10.0; and more preferably from 7.0 to 9.0; most preferably from 7.5 to 8.5);
   wherein at least a portion of the surface is in contact with both the polishing pad and the chemical mechanical polishing composition.

The chemical mechanical polishing (CMP) polishing compositions comprise from 0.005 wt. % to 25 wt. %; preferably from 0.05 wt. % to 5 wt. %, and more preferably from 0.1 wt. % to 2.5 wt. % of abrasive.

The abrasive includes, but is not limited to nano-sized colloidal silica or high purity colloidal silica particles; nano-sized inorganic metal oxide particles selected from the group consisting of alumina, titania, zirconia, ceria and combinations thereof; nano-sized diamond particles; nano-sized silicon nitride particles; mono-modal, bi-modal, or multi-modal colloidal abrasive particles; organic polymer-based soft abrasives; surface-coated or modified abrasives such as ceria coated silica particles and combinations thereof.

The chemical mechanical polishing (CMP) polishing compositions comprise from 0.05 wt. % to 5 wt. %; preferably from 0.1 wt. % to 2.50 wt. %; more preferably from 0.5 wt. % to 2 wt. %; and most preferably from 0.825 wt. % to 1.65 wt. % of alanine comprising α-amino group.

Alanine may comprise different optical isomers such as D-Alanine, L-alanine and their racemic mixture DL-alanine.

The chemical mechanical polishing (CMP) polishing compositions comprise from 2 ppm to 100 ppm, preferably 2 ppm to 50 ppm, more preferably 5 ppm to 20 ppm of a phosphate compound (compound comprising $H_2PO_4^{1-}$, $HPO_4^{2-}$ or $PO_4^{3-}$ group).

Phosphate may exist in phosphate ion (tribasic), hydrogen phosphate ion (dibasic), dihydrogen phosphate (mono-basic), or trihydrogen phosphate depending upon pH of the slurry. The phosphate compound may be inorganic salt of phosphoric acid or an organophosphate compound. Useful phosphate compounds may also include pyrophosphate compounds formed by condensing phosphates. Preferred phosphate compounds are inorganic phosphate compounds such as ammonium phosphate or potassium phosphate in either r monobasic, dibasic or tribasic forms.

The chemical mechanical polishing (CMP) polishing compositions comprise from 0.0005 wt. % to 0.5 wt. % preferably from 0.0025 wt. % to 0.25 wt. % and more preferably from 0.05 wt. % to 0.15 wt. % of corrosion inhibitor. The corrosion inhibitor includes, but is not limited to 1,2,4-triazole and its derivatives, benzotriazole and its derivatives, 1,2,3-triazole and its derivatives, pyrazole and its derivatives, imidazole and its derivatives, benzimidazole and its derivatives, isocyanurate and its derivatives, and combinations thereof.

The chemical mechanical polishing (CMP) polishing compositions optionally comprise a chelating agent ranging from 0.01 wt. % to 10 wt. %, preferably from 0.1 wt. % to 5 wt. %, more preferably from 0.5 wt. % to 2 wt. %, and most preferably from 0.825 wt. % to 1.65 wt. %.

The chelating agent includes but is not limited to glycine, serine, proline, histidine, isoleucine, leucine, lysine, methionine, phenylalanine, threonine, tryptophan, valine, arginine, asparagine, aspartic acid, cystein, glutamic acid, glutamine, ornithine, picolinic acid, selenocystein, tyrosine, sarcosine, bicine, tricine, aceglutamide, n-acetylaspartic acid, acetylcarnitine, acetylcysteine, n-acetylglutamic acid, acetylleucine, acivicin, s-adenosyl-l-homocysteine, agaritine, alanosine, aminohippuric acid, l-arginine ethyl ester, aspartame, aspartylglucosamine, benzylmercapturic acid, biocytin, brivanib alaninate, carbocisteine, n(6)-carboxymethyllysine, carglumic acid, cilastatin, citiolone, coprine, dibromotyrosine, dihydroxyphenylglycine, eflornithine, fenclonine, 4-fluoro-l-threonine, n-formylmethionine, gamma-l-glutamyl-l-cysteine, 4-(γ-glutamylamino)butanoic acid, glutaurine, glycocyamine, hadacidin, hepapressin, lisinopril, lymecycline, n-methyl-d-aspartic acid, n-methyl-l-glutamic acid, milacemide, nitrosoproline, nocardicin a, nopaline, octopine, ombrabulin, opine, orthanilic acid, oxaceprol, polylysine, remacemide, salicyluric acid, silk amino acid, stampidine, tabtoxin, tetrazolylglycine, thiorphan, thymectacin, tiopronin, tryptophan tryptophylquinone, valaciclovir, valganciclovir and combinations thereof.

The preferred chelating agents are glycine, picolinic acid, and combinations thereof.

The chemical mechanical polishing (CMP) polishing compositions optionally comprise from 0.005 wt. % to 10 wt. %; preferably from 0.25 wt. % to 3 wt. %, and more preferably from 0.5% to 1.5% oxidizer. The oxidizer includes, but is not limited to periodic acid, hydrogen peroxide, potassium iodate, potassium permanganate, ammonium persulfate, ammonium molybdate, ferric nitrate, nitric acid, potassium nitrate, and mixtures thereof; wherein the preferred oxidizer is hydrogen peroxide.

The chemical mechanical polishing (CMP) polishing compositions have pH from about 2.0 to about 12; preferably from 6.0 to 10.0; more preferably from 7.0 to 9.0; and most preferably from 7.5 to 8.5.

The chemical mechanical polishing (CMP) polishing compositions optionally comprise from 0.01 wt. % to 0.5 wt. %; preferably from 0.05 wt. % to 0.15 wt. % pH adjusting agent. The pH adjusting agent includes, but is not limited to nitric acid, hydrochloric acid, sulfuric acid, phosphoric acid, sodium hydride, potassium hydroxide, ammonium hydroxide, tetraalkylammonium hydroxide, organic amines, and mixtures thereof; wherein the preferred pH adjusting agent is nitric acid.

The chemical mechanical polishing (CMP) polishing compositions optionally comprise from 0.00001 wt. % to 0.10 wt. %, preferably from 0.0001 wt. % to 0.005 wt. %, and more preferably from 0.00015 wt. % to 0.0025 wt. % of a biocide.

The biocide includes but is not limited to tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, sodium hypochlorite, isothiazolinone compounds such as methylisothiazolinone, methylchloroisothiazolinone and benzisothiazolinone. Some of the commercially available preservatives include KATHON™ and NEOLENE™ product families from Dow Chemicals and Preventol™ family from Lanxess. The preferred biocides are isothiozilone compounds such as methylisothiazolinone, methylchloroisothiazolinone and benzisothiazolinone The chemical mechanical polishing (CMP) polishing compositions optionally comprise from 0.0005 wt. % to 0.15 wt. %, preferably from 0.001 wt. % to 0.05 wt. %, and more preferably from 0.0025 wt. % to 0.025 wt. % of a surfactant. The surfactant includes, but is not limited to non-ironic surfactants, such as acetylenic diol type of surfactants and ethoxylate/propyloxylate surfactants, anionic surfactants, such as sulfonic acids/salts, carboxylates, phosphates, cationic surfactants, such as most quaternary ammonium based surfactants, and amphoteric surfactants, such as betaines and amino acid derivatives based surfactants.

The chemical mechanical polishing (CMP) polishing compositions optionally comprise from 0.0001 wt. % t to 0.20 wt. %; preferably from 0.0010 wt. % to 0.10 wt. %, more preferably from 0.0025 wt. % to 0.050 wt. % of an amine compound. The amine compound includes, but is not limited to ethylene diamine, propylene diamine, organic amine compound containing multi amino groups in the same molecular, and combinations thereof.

The ratio of removal rate of the first material to the removal rate of the second material wherein the second material is dielectric film is equal or greater than 1; preferably 10, more preferably 50, and most preferably 100.

With disclosed compositions, the Co bulk CMP polishing compositions are able to provide desirable high and tunable Co film removal rates; low barrier film and dielectric film removal rates; reduced Co film static etch rates (SER) for better Co film corrosion protection; high and desirable removal selectivity of cobalt vs. dielectric films such as TEOS, $Si_xN_y$ (with $1.0<x<3.0$, $1.33<y<4.0$), SiCO, low-k, and ultra low-k films.

Other aspects, features and embodiments of the invention will be more fully apparent from the ensuing disclosure and appended claims.

BRIEF DESCRIPTION OF SEVERAL VIEWS OF THE DRAWINGS

FIG. 1 shows the cobalt removal rates with phosphate doping compositions

DETAILED DESCRIPTION OF THE INVENTION

Chemical mechanical polishing (CMP) compositions (or CMP slurries), methods and system for polish cobalt or cobalt-containing substrates are disclosed herein.

The cobalt bulk CMP polishing compositions disclosed herein comprises abrasive, alpha-alanine, phosphate compound, corrosion inhibitors, water, and other selected suitable chemical additive such as complexing agents or chelating agents, oxidizers; biological preservatives or biocide; surfactants or surface wetting agents for better surface wetting and surface tension reduction; pH adjusting agents to optimize pH operation window for the optimized polish performances.

With disclosed compositions, the Co bulk CMP polishing compositions are able to provide desirable high and tunable Co film removal rates; low barrier film and dielectric film removal rates; reduced Co film static etch rates (SER) for better Co film corrosion protection; high and desirable removal selectivity of cobalt vs. dielectric films such as TEOS, $Si_xN_y$ (with $1.0<x<3.0$, $1.33<y<4.0$), SiCO, low-k, and ultra low-k films.

The chemical mechanical polishing (CMP) polishing compositions have pH from about 2.0 to about 12; preferably from 6.0 to 10.0; more preferably from 7.0 to 9.0; and most preferably from 7.5 to 8.5.

Method for polishing involves providing a semiconductor substrate having a surface containing a first material and at least one second material; wherein the first material comprises Co and the second material is selected from the group consisting of dielectric films (such as TEOS, $Si_xN_y$ (with $1.0<x<3.0$, $1.33<y<4.0$), SiC, low-k and ultra-low-k films) and barrier films (such as Ti, TiN, Ta, TaN).

The Co bulk CMP polishing compositions contain 0.005 wt. % to 25 wt. % abrasives; preferably from 0.05 wt. % to 5 wt. %; and more preferably from 0.1 wt. % to 2.5 wt. %.

Abrasive used for Co CMP polishing compositions are nano-sized particles include, but are not limited to, nano-sized colloidal silica or high purity colloidal silica particles; nano-sized inorganic metal oxide particles, such as alumina, titania, zirconia, ceria, and combinations thereof; nano-sized diamond particles; nano-sized silicon nitride particles;

mono-modal, bi-modal, or multi-modal colloidal abrasive particles; organic polymer-based soft abrasives; surface-coated or modified abrasives; and combinations thereof.

The surface-coated or modified abrasives include but are not limited to the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, surface-coated or modified abrasives, and mixtures thereof.

The nano-sized particles have narrow or broad particle size distributions, various sizes and various shapes. The various shapes of the abrasives include spherical shape, cocoon shape, aggregate shape and other shapes.

The chemical mechanical polishing (CMP) polishing compositions comprise from 0.05 wt. % to 5 wt. %; preferably from 0.1 wt. % to 2.5 wt. %; more preferably from 0.5 wt. % to 2 wt. %; and most preferably from 0.825 wt. % to 1.65 wt. % of alanine comprising α-amino group.

Alanine having α-amino group is an α-alanine wherein the amino group is at the α-position from the carboxylate group.

The α-alanine comprises D-alanine, L-alanine. The "L" refers to the "left-handed" chemical form (or the L isomer) of the alpha-alanine molecule. The "D" refers to the "right-handed" chemical form (or the D isomer) of the molecule. The L and D forms are mirror-images of each other.

The α-alanine comprises D-alanine, L-alanine, and DL-alanine which is a racemic mixture of D- and L-alanine.

The CMP polishing compositions comprise from 2 ppm to 100 ppm, preferably 2 ppm to 50 ppm, more preferably 5 ppm to 20 ppm of a phosphate compound (compound comprising $H_2PO_4^{1-}$, $HPO_4^{2-}$, or $PO_4^{3-}$ group).

Phosphate may exist in phosphate ion (tribasic) or hydrogen phosphate ion (dibasic) or dihydrogen phosphate (mono-basic) or trihydrogen phosphate depending upon pH of the slurry. The phosphate compound may be inorganic salt of phosphoric acid or an organophosphate compound. Useful phosphate compounds may also include pyrophosphate compounds formed by condensing phosphates. Examples of inorganic phosphate compounds include salts of phosphoric acid with sodium, potassium, rubidium, cesium, ammonium or quaternary ammonium hydroxides. Organic phosphates could include esters of phosphoric acids. The organic phosphate compounds may also comprise other functional groups such as halides, thiols, carbonyls, amines, amides, ketones, aldehydes, carboxylic group, etc. Examples of organophosphate compounds include dimethyl phosphate, trimethyl phosphate, O,O-Diethyl thiophosphate potassium salt, butyl acid phosphate, Tris(2-chloroethyl) phosphate, Isopropyl phosphate, tributyl phosphates, etc. Preferred compounds are monobasic or dibasic or tribasic phosphates or mixtures thereof with ammonium or potassium counter-ions.

The CMP polishing compositions contain 0.0005 wt. % to 0.5 wt. % corrosion inhibitor; preferably from 0.0025 wt. % to 0.25 wt. %; and more preferably from 0.05 wt. % to 0.15 wt. %.

Corrosion inhibitors used for the cobalt bulk CMP slurry include, but are not limited to, 1,2,4-triazole and its derivatives, benzotriazole and its derivatives, 1,2,3-triazole and its derivatives, pyrazole and its derivatives, imidazole and its derivatives, benzimidazole and its derivatives, isocyanurate and its derivatives, and combinations thereof.

The CMP polishing compositions comprise 0.005 wt. % to 10 wt. % oxidizer; preferably from 0.25 wt. % to 3 wt. %, and more preferably from 0.5 wt. % to 1.5 wt. %.

Oxidizers used for the CMP polishing compositions include, but are not limited to, periodic acid, hydrogen peroxide, potassium iodate, potassium permanganate, ammonium persulfate, ammonium molybdate, ferric nitrate, nitric acid, potassium nitrate, and mixtures thereof. The preferred oxidizer is hydrogen peroxide.

The CMP polishing compositions may optionally comprise organic and amino acids as chelating or complexing agents.

The chelating agent ranges from 0.01 wt. % to 10 wt. %, preferably from 0.1 wt. % to 5 wt. %, more preferably from 0.5 wt. % to 2 wt. %, and most preferably from 0.825 wt. % to 1.65 wt. %.

The chelating agent includes but is not limited to glycine, serine, proline, histidine, isoleucine, leucine, lysine, methionine, phenylalanine, threonine, tryptophan, valine, arginine, asparagine, aspartic acid, cystein, glutamic acid, glutamine, ornithine, picolinic acid, selenocystein, tyrosine, sarcosine, bicine, tricine, aceglutamide, n-acetylaspartic acid, acetylcarnitine, acetylcysteine, n-acetylglutamic acid, acetylleucine, acivicin, s-adenosyl-l-homocysteine, agaritine, alanosine, aminohippuric acid, l-arginine ethyl ester, aspartame, aspartylglucosamine, benzylmercapturic acid, biocytin, brivanib alaninate, carbocisteine, n(6)-carboxymethyllysine, carglumic acid, cilastatin, citiolone, coprine, dibromotyrosine, dihydroxyphenylglycine, eflornithine, fenclonine, 4-fluoro-l-threonine, n-formylmethionine, gamma-l-glutamyl-l-cysteine, 4-(γ-glutamylamino)butanoic acid, glutaurine, glycocyamine, hadacidin, hepapressin, lisinopril, lymecycline, n-methyl-d-aspartic acid, n-methyl-l-glutamic acid, milacemide, nitrosoproline, nocardicin a, nopaline, octopine, ombrabulin, opine, orthanilic acid, oxaceprol, polylysine, remacemide, salicyluric acid, silk amino acid, stampidine, tabtoxin, tetrazolylglycine, thiorphan, thymectacin, tiopronin, tryptophan tryptophylquinone, valaciclovir, valganciclovir, and combinations thereof.

The preferred chelating agent are glycine, picolinic acid, and combinations thereof.

The CMP polishing compositions may contain 0.01 wt. % to 0.5 wt. %; and preferably from 0.05 wt. % to 0.15 wt. % of pH adjusting agent.

pH adjusting agents used for the CMP polishing compositions include, but are not limited to, nitric acid, hydrochloric acid, sulfuric acid, phosphoric acid, various inorganic and organic acids, and mixtures thereof.

pH adjusting agents also include that basic pH adjusting agents, such as sodium hydride, potassium hydroxide, ammonium hydroxide, tetraalkyl hydroxide, organic amines, and other chemical reagents that can be used to adjust pH towards more alkaline direction. The preferred pH adjusting agent is nitric acid.

The chemical mechanical polishing (CMP) polishing compositions optionally comprise from 0.0001 wt. % t to 0.20 wt. %; preferably from 0.0010 wt. % to 0.10 wt. %, and more preferably from 0.0025 wt. % to 0.050 wt. % of an amine compound;

The amine compounds are used to boost cobalt film removal rates. The amine compounds may include, but are not limited to ethylene diamine, propylene diamine, other organic diamine compounds, and organic amine compounds containing multi amino groups in the same molecular framework.

The CMP polishing compositions may contain 0.0005 wt. % to 0.15 wt. % surfactants; the preferred concentration of surfactants ranges from 0.001 wt. % to 0.05 wt. %. The more preferred concentration of surfactants ranges from 0.0025 wt. % to 0.025 wt. %.

Surfactants or surface wetting agents used for the CMP polishing compositions include, but are not limited to, non-ironic surfactants, such as dynol type of surfactants and tergitol type of surfactants; anionic surfactants, such as dodecyl sulfate sodium salts or potassium salts; cationic surfactants, such as most quaternary ammonium based surfactants; and amphoteric surfactants, such as betaines and amino acid derivatives based surfactants.

The CMP polishing compositions often require additives to prevent bacterial and fungal growth during storage. The CMP polishing compositions optionally contain a biocide ranging from 0.00001 wt. % to 0.10 wt. %, preferably from 0.0001 wt. % to 0.005 wt. %, and more preferably from 0.00015 wt. % to 0.0025 wt. % to prevent bacterial and fungal growth during storage.

The biocide includes but is not limited to quaternary ammonium compounds and chlorine compounds, isothiazolone compounds, tetramethylammonium chloride, tetraethylammonium chloride, tetrapropylammonium chloride; and combinations thereof.

Some of the additives to control biological growth are disclosed in U.S. Pat. No. 5,230,833 (Romberger et al.) and US Patent Application No. US 20020025762.

Biological growth inhibitors include but are not limited to tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, sodium hypochlorite, isothiazolinone compounds such as methylisothiazolinone, methylchloroisothiazolinone and benzisothiazolinone. Some of the commercially available preservatives include KATHON™ and NEOLENE™ product families from Dow Chemicals and Preventol™ family from Lanxess.

The preferred biocides are isothiozilone compounds such as methylisothiazolinone, methylchloroisothiazolinone and benzisothiazolinone In certain embodiments, the slurry components may have concentrated by reducing water in the formulation and be subsequently diluted at point of use with water addition. Slurry formulation may be split into two or more components, that are mixed at the point of use to help with any issues such as particle stability, chemical stability, peroxide stability.

Formulations of this invention are useful for polishing cobalt containing films including pure cobalt and alloys of cobalt at high removal rates. In certain embodiments the cobalt films can be polished at a removal rates greater than 500 Angstroms/min or more preferably greater than 750 Angstroms/min or most preferably more than 1000 Angstroms/min.

Further, the polishing compositions of this invention can be used to polish cobalt films selectively compared to a second film serving as a different function such as barrier, liner or dielectric. In certain embodiments, the removal rate selectivity between cobalt and the second film is greater than 10 or more preferably greater than 25 or most preferably greater than 50.

WORKING EXAMPLES

The features and advantages of the invention are more fully shown by the following non-limiting examples.

Experimental Section

Polishing Pad: Dow's IC1010 Pad was used during CMP, supplied by Dow Chemicals Corp.

Parameters:
Å: angstrom(s)—a unit of length
BP: back pressure, in psi units
CMP: chemical mechanical planarization=chemical mechanical polishing
CS: carrier speed
DF: Down force: pressure applied during CMP, unit: psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Removal Rates
Cobalt removal rate (Co RR) was measured at 1.5 psi down pressure of the CMP tool Working Examples The features and advantages of the invention are more fully shown by the following non-limiting examples.

Experimental Section

Parameters:
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min In the examples to be presented, CMP experiments were run using the procedures and experimental conditions given below.

The CMP tool that was used in the examples is a Mirra®, manufactured by Applied Materials, 3050 Boweres Avenue, Santa Clara, Calif., 95054. An IC1010 pad, supplied by Dow Chemical Co., Ltd., was used on the platen for the blanket wafer polishing studies. Pads were broken-in by polishing ten dummy Cu wafers. To qualify the tool settings and the pad break-in, one Cu monitors was polished with Cu4545, supplied by Planarization Platform of Air Products Chemicals Inc., at baseline conditions. Polishing experiments were conducted using blanket PVD cobalt wafer with 5K Angstroms in thickness. These blanket wafers were purchased from Silicon Valley Microelectronics, 1150 Campbell Ave, CA, 95126.

The associated methods described herein entail use of the composition for chemical mechanical planarization of substrates comprised of cobalt. In the methods, a substrate (e.g., a wafer with Co surface or Co plug) was placed face-down on a polishing pad which was fixedly attached to a rotatable platen of a CMP polisher. In this manner, the substrate to be polished and planarized was placed in direct contact with the polishing pad. A wafer carrier system or polishing head was used to hold the substrate in place and to apply a downward pressure against the backside of the substrate during CMP processing while the platen and the substrate were rotated. The polishing composition (slurry) was applied (usually continuously) on the pad during CMP processing for effective removal of material and planarizing the substrate.

All Cobalt removal rates (Co RR) are measured at 1.5 psi down pressure of the CMP tool, unless otherwise indicated.

All percentages are weight percentages unless otherwise indicated.

Other experimental polishing parameters include a table speed of 90.0 RPM, head speed of 84 RPM, slurry flow of 200 mL/min, conditioner force of 7.0 lb, in-situ conditioning for 60 seconds, and 30 seconds of polishing time.

The polishing composition and associated methods described herein are effective for CMP of a wide variety of substrates.

DL-alanine powder was purchased from Musashino Chemical Laboratories Ltd., located at 1-1-1, Yaesudai Bld. 7F, Kyobashi, Chuo-ku, Tokyo, 104-0031, Japan.

β-alanine powder was purchased from Yuki Gosei Kogyo Co., LTD.

Example 1

The Musashino DL-alanine powder was prepared for Ion Chromatography (IC) analysis.

The powder was analyzed for fluoride, chloride, nitrite, sulfate, bromide, nitrate, phosphate, and ammonium concentration by IC (Dionex ICS-2100), and results were given in Table 1.

TABLE 1

IC Results of DL-alanine Powder

| Fluoride (ppm) | Chloride (ppm) | Nitrite (ppm) | Sulfate (ppm) | Bromide (ppm) | Nitrate (ppm) | Phosphate (ppm) | Ammonium (ppm) |
|---|---|---|---|---|---|---|---|
| ND | 4.1 | ND | BD | ND | ND | ND | BD |

ND indicated that there was no peak detected; and BD indicated that the detected peak intensity was not high enough to quantify as the data, i.e., below detection limit (likely <1 ppm). Both ND and BD thus indicated that the phosphate was at least <1 ppm.

The data in Table 1 has shown that DL-alanine did not have any phosphate detected.

Example 2

DL-alanine (Musashino) dilution in DIW was prepared for High Performance Liquid Chromatography (HPLC) analysis.

The dilution was prepared at 1.0 wt % DL-alanine and 1.0 wt % $H_2O_2$ as oxidizing agent. The rest of the composition was DIW. The pH value for the composition was not adjusted. The composition was not used for polishing Co.

The dilution was analyzed for DL-alanine concentration by HPLC (Waters e2695 HPLC) before $H_2O_2$ addition (Day 0), one day after $H_2O_2$ addition, and seven days after $H_2O_2$ addition, with result listed in Table 2.

TABLE 2

Degradation Measurement of 1.0 wt. % DL-alanine Solutions in DIW with 1.0 wt. % $H_2O_2$ (HPLC Analysis)

| | Normalized DL-alanine Concentration (%) vs Days with $H_2O_2$ | | |
|---|---|---|---|
| Composition | Day 0 | Day 1 | Day 7 |
| DL-alanine | 99.9 | 100.1 | 100.6 |

The data showed in Table 2 has demonstrated that Musashino DL-alanine composition was stable for at least 7 days, with a change in concentration of DL-alanine of 1.2 wt. % or less.

Example 3

Three CMP polishing compositions were prepared using the supplier of DL-alanine, and compositions were doped with dipotassium phosphate (potassium phosphate dibasic) or ammonium phosphate dibasic. The composition not doped was used as the control.

All compositions comprised of 0.6210 wt. % high purity colloidal silica particles having Mean Particle Size (MPS) about 70 nm as measured by Dynamic Light Scattering (DLS) technique; 0.0002 wt. % Kathon II as biocide; 0.002 wt. % ethylene diamine; 0.00025 wt. % 1,3,5-Tris(2-hydroxyethyl)isocyanurate; 0.0946 wt. % 3-amino-1,2,4-triazole; 1.10 wt. % DL-alanine; potassium hydroxide as pH adjusting agent; and 1.0 wt % $H_2O_2$ as oxidizing agent.

One composition comprised 0.0010 wt./%(10 ppm) dipotassium phosphate, and another composition comprised 0.0008 wt. % (8 ppm) ammonium phosphate dibasic.

The rest of the compositions was DI Water. The pH value of the compositions was approximately 8.0.

The removal rates (RR) (Å/30 s) of Co were shown in Table 3.

TABLE 3

Co RR Doped with Ammonium Phosphate vs Potassium Phosphate

| Composition | Co Removal in 30 s (Å) |
|---|---|
| DL-alanine, no Phosphate (control) | 328 |
| DL-alanine + 8 ppm Ammonium Phosphate | 1039 |
| DL-alanine + 10 ppm Potassium Phosphate | 1066 |

The results in Table 3 demonstrated that Co RR boosting effect was achieved with approximately equal little molar amounts of ammonium phosphate dibasic or potassium phosphate dibasic doped into the compositions.

Example 4

Two cobalt bulk CMP polishing compositions were prepared by doping ammonium phosphate and potassium phosphate into compositions not having any alanine.

More specifically, the two compositions both comprised of 0.6210 wt % high purity colloidal silica particles having MPS about 70 nm; 0.0002 wt % Kathon II as biocide; 0.002 wt % ethylene diamine; 0.00025 wt % 1,3,5-Tris(2-hydroxyethyl)isocyanurate; 0.0946 wt % 3-amino-1,2,4-triazole; 0.0010 wt. % (10 ppm) ammonium phosphate dibasic or 0.0020 wt. % (20 ppm) potassium phosphate dibasic; potassium hydroxide as pH adjusting agent; and 1.0 wt % $H_2O_2$ as oxidizing agent. The rest of the composition was DIW. The pH value of the compositions was approximately 8.0.

The removal rates (RR) (Å/30 s) of Co were shown in Table 4.

TABLE 4

Co RR of Phosphate Doped Compositions without Alanine

| Composition | Co Removal in 30 s (Å) |
|---|---|
| No Alanine + 10 ppm Ammonium Phosphate | 110 |
| No Alanine + 20 ppm Potassium Phosphate | 126 |

The results in Table 4 demonstrated that within the doping levels of phosphate, the phosphate alone did not enable the Co RR boosting. This result coupled with the previous result in Examples 3 have shown that the combination of DL-alanine and phosphate has synergistically increased the Co RR. Furthermore, this boosting effect can be precisely controlled with the amount of phosphate ion that is doped in the cobalt bulk CMP polishing compositions.

Example 5

The composition comprised of 0.6210 wt. % high purity colloidal silica particles having MPS about 70 nm; 0.0002 wt. % Kathon II as biocide; 0.002 wt. % ethylene diamine; 0.00025 wt. % 1,3,5-Tris(2-hydroxyethyl)isocyanurate; 0.0946 wt. % 3-amino-1,2,4-triazole; 1.10 wt. % DL-alanine; potassium hydroxide as pH adjusting agent; and 1.0 wt % $H_2O_2$ as oxidizing agent, and different concentrations of ammonium phosphate dibasic, as shown in Table 5. The rest of the compositions was DI Water. The pH value of the compositions was approximately 8.0.

The removal rates (RR) (Å/30 s) of Co were shown in Table 5.

The results have shown that with 1 ppm phosphate dopant concentration in the polishing composition, there was no apparent Co removal rate boosting observed.

The Co removal rate started to rise when the phosphate dopant concentrations were >2 ppm.

TABLE 5

Co RR Doped with Ammonium Phosphate vs Potassium Phosphate

| Ammonium Phosphate(ppm) | Co Removal in 30 s (Å) |
|---|---|
| 0 | 296 |
| 0.5 | 250 |
| 1 | 300 |
| 2 | 348 |
| 3 | 373 |
| 4 | 322 |
| 5 | 424 |
| 6 | 655 |
| 7 | 939 |
| 8 | 1033 |
| 9 | 1154 |
| 10 | 1632 |

Example 6

Eighteen cobalt bulk CMP polishing compositions were prepared using DL-alanine (Musashino) and doped with varying concentrations of ammonium phosphate dibasic.

Eighteen compositions all comprised of 0.6210 wt % high purity colloidal silica particles having MPS about 70 nm; 0.0002 wt % Kathon II as biocide; 0.002 wt % ethylene diamine; 0.00025 wt % 1,3,5-Tris(2-hydroxyethyl)isocyanurate; 0.0946 wt % 3-amino-1,2,4-triazole; 1.10 wt % DL-alanine; between 0.00005 wt. % (0.5 ppm) and 0.010 wt. % (100 ppm) ammonium phosphate dibasic; potassium hydroxide as pH adjusting agent; and 1.0 wt % $H_2O_2$ as oxidizing agent. The rest of the composition was DIW. The pH value of the compositions was approximately 8.0.

The polishing results of these samples were shown in FIG. 1.

The results in FIG. 1 demonstrated that the correct concentration of phosphate enabled an increase in Co RR by as much as 575%. The CMP compositions comprised with DL-alanine showed an increase in Co RR when doped with between 2 and 25 ppm ammonium phosphate dibasic, with a maximum Co RR of 1808 Å/30 s occurring at 15 ppm. At concentrations of 25 ppm and higher of ammonium phosphate dibasic, the Co RR was shut down and matches the low Co RR of the un-doped compositions made using Musashino DL-alanine.

Example 7

The composition comprised of 0.6210 wt. % high purity colloidal silica particles having MPS about 70 nm; 0.0002 wt. % Kathon II as biocide; 0.002 wt. % ethylene diamine; 0.00025 wt. % 1,3,5-Tris(2-hydroxyethyl)isocyanurate; 0.0946 wt. % 3-amino-1,2,4-triazole; 1.10 wt. % DL-alanine; potassium hydroxide as pH adjusting agent; and 1.0 wt % $H_2O_2$ as oxidizing agent, and 0.0010 wt./%(10 ppm) ammonium phosphate dibasic. The rest of the compositions was DIW. The pH value of the compositions was approximately 8.0.

Under the same polishing conditions, the removal rate (RR) (Å/30 s) of Co was >1100 Å/30 s and the removal rate (RR) (Å/30 s) of TiN was 7 Å/min.

The selectivity for Co RR:TiN RR for the composition was >150.

Example 8

The Co slurries using different alanine were studied. The alanine being tested were DL-Alanine (Musashino), Beta-alanine (Yuki Gosei Kogyo Co.).

Beta- or β-alanine comprises a beta amino group, i.e., the amino group is at the β-position from the carboxylate group.

Alpha-alanine and beta-alanine are having different chemical structures.

The composition comprised of 0.6210 wt. % high purity colloidal silica particles having MPS about 70 nm; 0.0002 wt. % Kathon II as biocide; 0.002 wt. % ethylene diamine; 0.00025 wt. % 1,3,5-Tris(2-hydroxyethyl)isocyanurate; 0.0946 wt. % 3-amino-1,2,4-triazole; 1.10 wt. % alanine; potassium hydroxide as pH adjusting agent; and 1.0 wt % $H_2O_2$ as oxidizing agent, and 0.0015 wt./%(15 ppm) ammonium phosphate dibasic. The rest of the compositions was DIW. The pH value of the compositions was approximately 8.0.

The Co formulations containing no phosphate dopant were used as reference sample.

The Co RR from the formulations were shown in Table 6.

TABLE 6

Co Removal Rates with Different Chelators

| Sample | Conductivity (µS) | Co RR (A/min.) |
|---|---|---|
| 1.1% DL-Alanine, no Dopant | 162.3 | 139 |
| 1.1% DL-Alanine, 15 ppm Phosphate as Dopant | 197.3 | 1266 |
| 1.1% Beta-Alanine, no Dopant | 119.1 | 89 |
| 1.1% Beta-Alanine, 15 ppm Phosphate as Dopant | 108.3 | 85 |

It's evident from table 6 that compositions using DL-Alanine with a dopant had shown an unexpected result of boosting cobalt removal rate.

The forgoing working examples had demonstrated that with the combination of the different phosphate additives, the disclosed chemical mechanical polishing (CMP) compositions and methods provided desirable high and tunable Co film removal rates.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A chemical mechanical polishing (CMP) polishing composition for cobalt-containing substrate, consisting essentially of:
    0.005 wt. % to 25 wt. % of abrasive;
    0.05 wt. % to 5 wt. % of α-alanine;
    from 2 ppm to 50 ppm of phosphate compound comprising $H_2PO_4^{1-}$, $HPO_4^{2-}$, or $PO_4^{3-}$;
    0.0005 wt. % to 0.25 wt. % of corrosion inhibitor;
    0.005 wt. % to 10 wt. % of oxidizer;
    water; and
    optionally at least one of:
    0.0001 wt. % t to 0.20 wt. % of amine compound;
    0.01 wt. % to 10 wt. % of chelating agent;
    0.01 wt. % to 0.5 wt. % of pH adjusting agent;
    0.00001 wt. % to 0.10 wt. % of biocide; and
    0.0005 wt. % to 0.15 wt. % of surfactant;
    wherein the chemical mechanical polishing (CMP) polishing composition having a pH from 2.0 to about 12.

2. The chemical mechanical polishing (CMP) polishing composition for cobalt-containing substrate of claim 1, wherein the abrasive is selected from the group consisting of nano-sized colloidal silica or high purity colloidal silica particles; nano-sized inorganic metal oxide particles selected from the group consisting of alumina, titania, zirconia, ceria and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof; and ranges from 0.05 wt. % to 5 wt. %;
    the α alanine is selected from the group consisting of D-Alanine, L-Alanine, DL-Alanine, and combinations thereof; and ranges from 0.5 wt. % to 2 wt. %;
    the phosphate compound comprising $H_2PO_4^{1-}$, $HPO_4^{2-}$ or $PO_4^{3-}$ is in a form selected from the group consisting of phosphate ion (tribasic), hydrogen phosphate ion (dibasic), dihydrogen phosphate (mono-basic), trihydrogen phosphate, and combinations thereof;
    the corrosion inhibitor is selected from the group consisting of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and combinations thereof; and ranges from 0.0025 wt. % to 0.25 wt. %;
    the oxidizing agent is selected from the group consisting of periodic acid, hydrogen peroxide, potassium iodate, potassium permanganate, ammonium persulfate, ammonium molybdate, ferric nitrate, nitric acid, potassium nitrate, and mixtures thereof; and ranges from f0.25 wt. % to 3 wt. %; and
    the chemical mechanical polishing (CMP) polishing composition having a pH from 6.0 to about 10.

3. The chemical mechanical polishing (CMP) polishing composition for cobalt-containing substrate of claim 1, wherein
    the chelating agent ranges from 0.1 wt. % to 5 wt. % and is selected independently from the group consisting of glycine, serine, proline, histidine, isoleucine, leucine, lysine, methionine, phenylalanine, threonine, tryptophan, valine, arginine, asparagine, aspartic acid, cystein, glutamic acid, glutamine, ornithine, picolinic acid, selenocystein, tyrosine, sarcosine, bicine, tricine, aceglutamide, n-acetylaspartic acid, acetylcarnitine, acetylcysteine, n-acetylglutamic acid, acetylleucine, acivicin, s-adenosyl-l-homocysteine, agaritine, alanosine, aminohippuric acid, l-arginine ethyl ester, aspartame, aspartylglucosamine, benzylmercapturic acid, biocytin, brivanib alaninate, carbocisteine, n(6)-carboxymethyllysine, carglumic acid, cilastatin, citiolone, coprine, dibromotyrosine, dihydroxyphenylglycine, eflornithine, fenclonine, 4-fluoro-l-threonine, n-formylmethionine, gamma-l-glutamyl-l-cysteine, 4-(γ-glutamylamino)butanoic acid, glutaurine, glycocyamine, hadacidin, hepapressin, lisinopril, lymecycline, n-methyl-d-aspartic acid, n-methyl-l-glutamic acid, milacemide, nitrosoproline, nocardicin a, nopaline, octopine, ombrabulin, opine, orthanilic acid, oxaceprol, polylysine, remacemide, salicyluric acid, silk amino acid, stampidine, tabtoxin, tetrazolylglycine, thiorphan, thymectacin, tiopronin, tryptophan tryptophylquinone, valaciclovir, valganciclovir, and combinations thereof;
    the amine compound ranges from 0.0010 wt. % to 0.10 wt. %, and is selected independently from the group consisting of ethylene diamine, propylene diamine, organic amine compound containing multi amino groups in the same molecular, and combinations thereof;
    the pH adjusting agent ranges from 0.05 wt. % to 0.15 wt. %, and is selected from the group consisting of nitric acid, hydrochloric acid, sulfuric acid, phosphoric acid, sodium hydride, potassium hydroxide, ammonium hydroxide, tetraalkylammonium hydroxide, organic amines, and mixtures thereof;
    the biocide ranges from 0.0001 wt. % to 0.005 wt. %, and is selected from the group consisting of methylisothiazolinone; methylchloroisothiazolinone; quaternary ammonium compound selected from the group consisting of tetramethylammonium chloride, tetraethylammonium chloride, tetrapropylammonium chloride, alkylbenzyldimethylammonium chloride and alkylbenzyldimethylammonium hydroxide; wherein the alkyl chain ranges from 1 to about 20 carbon atoms; chloro-containing compound selected from the group consisting of chlorite and sodium hypochlorite; biguanide; aldehyde; ethylene oxide; metallic salt, isothiazolinone; indophor; and combinations thereof; and the surfactant ranges from 0.001 wt. % to 0.05 wt. %, and is selected from the group consisting of non-ionic surfactant selected from the group consisting of alcohol ethoxylates, acetylenic diol surfactants, and combinations thereof; anionic surfactant selected from the group consisting of secondary alkane sulfonates, dodecyl sulfate, sodium salt, lauryl sulfate, potassium salt, and combinations thereof; cationic surfactant selected from the group consisting of quaternary ammonium based surfactant; and amphoteric surfactant selected from the group consisting of betaine and amino acid derivatives based surfactant; and combinations thereof.

4. The chemical mechanical polishing (CMP) polishing composition for cobalt-containing substrate of claim 1, wherein the phosphate compound is an inorganic salt of phosphoric acid or an organophosphate compound.

5. The chemical mechanical polishing (CMP) polishing composition for cobalt-containing substrate of claim 1 consisting essentially of 0.1 wt. % to 2.5 wt. % of nano-sized colloidal silica or high purity colloidal silica particles; 0.825 wt. % to 1.65 wt. % of alanine selected from the group consisting of D-Alanine, L-Alanine, DL-Alanine, and combinations thereof; 5 ppm to 20 ppm of ammonium phosphate or potassium phosphate in monobasic, dibasic or tribasic form; 0.05 wt. % to 0.15 wt. % of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and combinations thereof; 0.5 wt. % to 1.5 wt. % of periodic acid, hydrogen peroxide, potassium iodate, potassium permanganate, ammonium persulfate, ammonium molybdate, ferric nitrate, nitric acid, potassium nitrate, and mixtures thereof; and the chemical mechanical polishing (CMP) polishing composition having a pH from 7.0 to about 9.0.

6. The chemical mechanical polishing (CMP) polishing composition for cobalt-containing substrate of claim 1, consisting essentially of at least one of 0.5 wt. % to 2 wt. % of glycine, picolinic acid, and combinations thereof;

0.0025 wt. % to 0.050 wt. % of ethylene diamine, propylene diamine, organic amine compound containing multi amino groups in the same molecular, and combinations thereof;

0.05 wt. % to 0.15 wt. % of nitric acid, hydrochloric acid, sulfuric acid, phosphoric acid, sodium hydride, potassium hydroxide, ammonium hydroxide, tetraalkylammonium hydroxide, and mixtures thereof;

0.00015 wt. % to 0.0025 wt. % of isothiozilone selected from the group consisting of methylisothiazolinone, methylchloroisothiazolinone, benzisothiazolinone, and combinations thereof; and 0.0025 wt. % to 0.025 wt. % of the surfactant.

7. The chemical mechanical polishing (CMP) polishing composition for cobalt-containing substrate of claim 1 consisting essentially of high purity colloidal silica particles; DL-Alanine, ammonium phosphate or potassium phosphate in monobasic, dibasic or tribasic form; 3-amino-1,2,4-triazole, 1,3,5-Tris(2-hydroxyethyl)isocyanurate, or combinations of 3-amino-1,2,4-triazole and 1,3,5-Tris(2-hydroxyethyl)isocyanurate, hydrogen peroxide, and ethylene diamine.

8. A method of a selective chemical mechanical polishing comprising:

a) providing a semiconductor substrate having a surface containing a first material and at least one second material; wherein the first material is Co and the second material is selected from the group consisting of dielectric film, low-k and ultra low-k film, and barrier film;

b) providing a polishing pad;
providing a chemical mechanical polishing composition consisting essentially of
0.005 wt. % to 25 wt. % of abrasive;
0.05 wt. % to 5 wt. % of ☐-alanine;
from 2 ppm to 100 ppm of phosphate compound is selected of the group consisting of $H_2PO_4^{1-}$, $HPO_4^{2-}$, or $PO_4^{3-}$;
0.0005 wt. % to 0.25 wt. % of corrosion inhibitor;
0.005 wt. % to 10 wt. % of oxidizer;
water; and
the chemical mechanical polishing (CMP) polishing composition having a pH from 2.0 to about 12;
and optionally
0.0001 wt. % t to 0.20 wt. % of amine compound;
0.01 wt. % to 10 wt. % of chelating agent;
0.01 wt. % to 0.5 wt. % of pH adjusting agent;
0.00001 wt. % to 0.10 wt. % of biocide; and
0.0005 wt. % to 0.15 wt. % of surfactant;
and c) polishing the surface of the semiconductor substrate to selectively remove the first material;
wherein at least a portion of the surface is in contact with both the polishing pad and the chemical mechanical polishing composition; and ratio of removal rate of the first material to removal rate of the second material is equal or greater than 50.

9. The method of a selective chemical mechanical polishing of claim 8, wherein the second material is selected from the group consisting of TEOS, SixNy (with 1.0<x<3.0, 1.33<y<4.0), Ta, TaN, Ti, and TiN.

10. The method of a selective chemical mechanical polishing of claim 8, wherein the chemical mechanical polishing composition consists essentially of the abrasive is selected from the group consisting of nano-sized colloidal silica or high purity colloidal silica particles; nano-sized inorganic metal oxide particles selected from the group consisting of alumina, titania, zirconia, ceria and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof; and ranges from 0.05 wt. % to 5 wt. %;

the alanine is selected from the group consisting of D-Alanine, L-Alanine, DL-Alanine, and combinations thereof; and ranges from 0.5 wt. % to 2 wt. %;

the phosphate compound is selected of the group consisting of $H_2PO_4^{1-}$, $HPO_4^{2-}$, or $PO_4^{3-}$ is in a form selected from the group consisting of phosphate ion (tribasic), hydrogen phosphate ion (dibasic), dihydrogen phosphate (mono-basic), trihydrogen phosphate (acid), and combinations thereof; and ranges from 2 ppm to 50 ppm;

the corrosion inhibitor is selected from the group consisting of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and combinations thereof; and ranges from 0.0025 wt. % to 0.25 wt. %;

the oxidizing agent is selected from the group consisting of periodic acid, hydrogen peroxide, potassium iodate, potassium permanganate, ammonium persulfate, ammonium molybdate, ferric nitrate, nitric acid, potassium nitrate, and mixtures thereof; and ranges from f0.25 wt. % to 3 wt. %;

the chemical mechanical polishing (CMP) polishing composition having a pH from 6.0 to about 10;

and optionally the chelating agent range from 0.1 wt. % to 5 wt. % and is selected independently from the group consisting of glycine, serine, proline, histidine, isoleucine, leucine, lysine, methionine, phenylalanine, threonine, tryptophan, valine, arginine, asparagine, aspartic acid, cystein, glutamic acid, glutamine, ornithine, picolinic acid, selenocystein, tyrosine, sarcosine, bicine, tricine, aceglutamide, n-acetylaspartic acid, acetylcarnitine, acetylcysteine, n-acetylglutamic acid, acetylleucine, acivicin, s-adenosyl-l-homocysteine, agaritine, alanosine, aminohippuric acid, l-arginine ethyl ester, aspartame, aspartylglucosamine, benzylmercapturic acid, biocytin, brivanib alaninate, carbocisteine, n(6)-carboxymethyllysine, carglumic acid, cilastatin, citiolone, coprine, dibromotyrosine, dihydroxyphenylglycine, eflornithine, fenclonine, 4-fluoro-l-threonine, n-formylmethionine, gamma-l-glutamyl-l-cysteine, 4-(γ-glutamylamino)butanoic acid, glutaurine, glycocyamine, hadacidin, hepapressin, lisinopril, lymecycline, n-methyl-d-aspartic acid, n-methyl-l-glutamic acid, milacemide, nitrosoproline, nocardicin a, nopaline, octopine, ombrabulin, opine, orthanilic acid, oxaceprol, polylysine, remacemide, salicyluric acid, silk amino acid, stampidine, tabtoxin, tetrazolylglycine, thiorphan, thymectacin, tiopronin, tryptophan tryptophylquinone, valaciclovir, valganciclovir, and combinations thereof;

the amine compound ranges from 0.0010 wt. % to 0.10 wt. %, and is selected independently from the group consisting of ethylene diamine, propylene diamine, organic amine compound containing multi amino groups in the same molecular, and combinations thereof;

the pH adjusting agent ranges from 0.05 wt. % to 0.15 wt. %, and is selected from the group consisting of nitric acid, hydrochloric acid, sulfuric acid, phosphoric acid, sodium hydride, potassium hydroxide, ammonium hydroxide, tetraalkylammonium hydroxide, organic amines, and mixtures thereof;

the biocide ranges from 0.0001 wt. % to 0.005 wt. %, and is selected from the group consisting of methylisothiazolinone; methylchloroisothiazolinone; quaternary ammonium compound selected from the group consisting of tetramethylammonium chloride, tetraethylammonium chloride, tetrapropylammonium chloride, alkylbenzyldimethylammonium chloride and alkylbenzyldimethylammonium hydroxide; wherein the alkyl chain ranges from 1 to about 20 carbon atoms; chloro-containing compound selected from the group consisting of chlorite and sodium hypochlorite; biguanide; aldehyde; ethylene oxide; metallic salt, isothiazolinone; indophor; and combinations thereof;

the surfactant ranges from 0.001 wt. % to 0.05 wt. %, and is selected from the group consisting of non-ionic surfactant selected from the group consisting of alcohol ethoxylates, acetylenic diol surfactants, and combinations thereof; anionic surfactant selected from the group consisting of secondary alkane sulfonates, dodecyl sulfate, sodium salt, lauryl sulfate, potassium salt, and combinations thereof; cationic surfactant selected from the group consisting of quaternary ammonium based surfactant; and amphoteric surfactant selected from the group consisting of betaine and amino acid derivatives based surfactant; and combinations thereof.

11. The method of a selective chemical mechanical polishing of claim 10, wherein the phosphate compound is an inorganic salt of phosphoric acid or an organophosphate compound.

12. The method of a selective chemical mechanical polishing of claim 8, wherein the chemical mechanical polishing (CMP) polishing consists essentially of 0.1 wt. % to 2.5 wt. % of nano-sized colloidal silica or high purity colloidal silica particles; 0.825 wt. % to 1.65 wt. % of alanine selected from the group consisting of D-Alanine, L-Alanine, DL-Alanine, and combinations thereof; 5 ppm to 20 ppm of ammonium phosphate or potassium phosphate in monobasic, dibasic or tribasic form; 0.05 wt. % to 0.15 wt. % of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and combinations thereof; 0.5 wt. % to 1.5 wt. % of periodic acid, hydrogen peroxide, potassium iodate, potassium permanganate, ammonium persulfate, ammonium molybdate, ferric nitrate, nitric acid, potassium nitrate, and mixtures thereof; and the chemical mechanical polishing (CMP) polishing composition having a pH from 7.0 to about 9.0;

and optionally 0.5 wt. % to 2 wt. % of glycine, picolinic acid, and combinations thereof;

0.0025 wt. % to 0.050 wt. % of ethylene diamine, propylene diamine, organic amine compound containing multi amino groups in the same molecular, and combinations thereof;

0.05 wt. % to 0.15 wt. % of nitric acid, hydrochloric acid, sulfuric acid, phosphoric acid, sodium hydride, potassium hydroxide, ammonium hydroxide, tetraalkylammonium hydroxide, and mixtures thereof;

0.00015 wt. % to 0.0025 wt. % of isothiozilone selected from the group consisting of methylisothiazolinone, methylchloroisothiazolinone, benzisothiazolinone, and combinations thereof; and 0.0025 wt. % to 0.025 wt. % of the surfactant.

13. The method of a selective chemical mechanical polishing of claim 12, wherein the chemical mechanical polishing (CMP) polishing composition consists essentially of high purity colloidal silica particles; DL-Alanine, ammonium phosphate or potassium phosphate in monobasic, dibasic or tribasic form; 3-amino-1,2,4-triazole, 1,3,5-Tris(2-hydroxyethyl)isocyanurate, or combinations of 3-amino-1,2,4-triazole and 1,3,5-Tris(2-hydroxyethyl)isocyanurate, hydrogen peroxide, and ethylene diamine.

14. The method of a selective chemical mechanical polishing of claim 13, wherein at least a portion of the surface is in contact with both the polishing pad and the chemical mechanical polishing composition; the second material is selected from the group consisting of TEOS, SixNy (with $1.0<x<3.0$, $1.33<y<4.0$), Ta, TaN, Ti, and TiN; and ratio of removal rate of the first material to removal rate of the second material is equal or greater than 100.

15. A chemical mechanical polishing (CMP) system comprising:
a semiconductor substrate having a surface containing a first material and at least one second material;
wherein the first material is Co and the second material is selected from the group consisting of dielectric films (such as TEOS, SixNy (with 1.0<x<3.0, 1.33<y<4.0), low-k and ultra low-k films, and barrier films (such as Ta, TaN, Ti, and TiN films);
a polishing pad;
a chemical mechanical polishing composition consisting essentially of
0.005 wt. % to 25 wt. % of abrasive;
0.05 wt. % to 5 wt. % of □-alanine;
from 2 ppm to 100 ppm of phosphate compound is selected of the group consisting of $H_2PO_4^{1-}$, $HPO_4^{2-}$, or $PO_4^{3-}$;
0.0005 wt. % to 0.25 wt. % of corrosion inhibitor;
0.005 wt. % to 10 wt. % of oxidizer;
water;
the chemical mechanical polishing (CMP) composition having a pH from 2.0 to about 12;
and optionally:
0.0001 wt. % t to 0.20 wt. % of amine compound;
0.01 wt. % to 10 wt. % of chelating agent;
0.01 wt. % to 0.5 wt. % of pH adjusting agent;
0.00001 wt. % to 0.10 wt. % of biocide; and
0.0005 wt. % to 0.15 wt. % of surfactant;
and
wherein at least a portion of the surface is in contact with both the polishing pad and the chemical mechanical polishing composition.

16. The chemical mechanical polishing (CMP) system of claim 15, wherein the chemical mechanical polishing composition consists essentially of
the abrasive is selected from the group consisting of nano-sized colloidal silica or high purity colloidal silica particles; nano-sized inorganic metal oxide particles selected from the group consisting of alumina, titania, zirconia, ceria and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof; and ranges from 0.05 wt. % to 5 wt. %;
the alanine is selected from the group consisting of D-Alanine, L-Alanine, DL-Alanine, and combinations thereof; and ranges from 0.5 wt. % to 2 wt. %;
the phosphate compound is selected of the group consisting of $H_2PO_4^{1-}$, $HPO_4^{2-}$, or $PO_4^{3-}$ is in a form selected from the group consisting of phosphate ion (tribasic), hydrogen phosphate ion (dibasic), dihydrogen phosphate (mono-basic), trihydrogen phosphate (acid), and combinations thereof; and ranges from 2 ppm to 50 ppm;
the corrosion inhibitor is selected from the group consisting of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and combinations thereof; and ranges from 0.0025 wt. % to 0.25 wt. %;
the oxidizing agent is selected from the group consisting of periodic acid, hydrogen peroxide, potassium iodate, potassium permanganate, ammonium persulfate, ammonium molybdate, ferric nitrate, nitric acid, potassium nitrate, and mixtures thereof; and ranges from f0.25 wt. % to 3 wt. %;
the chemical mechanical polishing (CMP) polishing composition having a pH from 6.0 to about 10;
and optionally
the chelating agent ranges from 0.1 wt. % to 5 wt. % and is selected independently from the group consisting of glycine, serine, proline, histidine, isoleucine, leucine, lysine, methionine, phenylalanine, threonine, tryptophan, valine, arginine, asparagine, aspartic acid, cystein, glutamic acid, glutamine, ornithine, picolinic acid, selenocystein, tyrosine, sarcosine, bicine, tricine, ace-glutamide, n-acetylaspartic acid, acetylcarnitine, acetylcysteine, n-acetylglutamic acid, acetylleucine, acivicin, s-adenosyl-l-homocysteine, agaritine, alanosine, aminohippuric acid, l-arginine ethyl ester, aspartame, aspartylglucosamine, benzylmercapturic acid, biocytin, brivanib alaninate, carbocisteine, n(6)-carboxymethyllysine, carglumic acid, cilastatin, citiolone, coprine, dibromotyrosine, dihydroxyphenylglycine, eflornithine, fenclonine, 4-fluoro-l-threonine, n-formylmethionine, gamma-l-glutamyl-l-cysteine, 4-(γ-glutamylamino)butanoic acid, glutaurine, glycocyamine, hadacidin, hepapressin, lisinopril, lymecycline, n-methyl-d-aspartic acid, n-methyl-l-glutamic acid, milacemide, nitrosoproline, nocardicin a, nopaline, octopine, ombrabulin, opine, orthanilic acid, oxaceprol, polylysine, remacemide, salicyluric acid, silk amino acid, stampidine, tabtoxin, tetrazolylglycine, thiorphan, thymectacin, tiopronin, tryptophan tryptophylquinone, valaciclovir, valganciclovir, and combinations thereof;
the amine compound ranges from 0.0010 wt. % to 0.10 wt. %, and is selected independently from the group consisting of ethylene diamine, propylene diamine, organic amine compound containing multi amino groups in the same molecular, and combinations thereof;
the pH adjusting agent ranges from 0.05 wt. % to 0.15 wt. %, and is selected from the group consisting of nitric acid, hydrochloric acid, sulfuric acid, phosphoric acid, sodium hydride, potassium hydroxide, ammonium hydroxide, tetraalkylammonium hydroxide, organic amines, and mixtures thereof;
the biocide ranges from 0.0001 wt. % to 0.005 wt. %, and is selected from the group consisting of methylisothiazolinone; methylchloroisothiazolinone; quaternary ammonium compound selected from the group consisting of tetramethylammonium chloride, tetraethylammonium chloride, tetrapropylammonium chloride, alkylbenzyldimethylammonium chloride and alkylbenzyldimethylammonium hydroxide; wherein the alkyl chain ranges from 1 to about 20 carbon atoms; chloro-containing compound selected from the group consisting of chlorite and sodium hypochlorite; biguanide; aldehyde; ethylene oxide; metallic salt, isothiazolinone; indophor; and combinations thereof;
the surfactant ranges from 0.001 wt. % to 0.05 wt. %, and is selected from the group consisting of non-ionic surfactant selected from the group consisting of alcohol ethoxylates, acetylenic diol surfactants, and combinations thereof; anionic surfactant selected from the group consisting of secondary alkane sulfonates, dodecyl sulfate, sodium salt, lauryl sulfate, potassium salt, and combinations thereof; cationic surfactant selected from the group consisting of quaternary ammonium based surfactant; and amphoteric surfactant selected from the group consisting of betaine and amino acid derivatives based surfactant; and combinations thereof.

17. The chemical mechanical polishing (CMP) system of claim 16, wherein the phosphate compound is an inorganic salt of phosphoric acid or an organophosphate compound.

18. The chemical mechanical polishing (CMP) system of claim 15, wherein the chemical mechanical polishing (CMP) polishing consists essentially of 0.1 wt. % to 2.5 wt. % of nano-sized colloidal silica or high purity colloidal silica particles; 0.825 wt. % to 1.65 wt. % of alanine selected from the group consisting of D-Alanine, L-Alanine, DL-Alanine, and combinations thereof; 5 ppm to 20 ppm of ammonium phosphate or potassium phosphate in monobasic, dibasic or tribasic form; 0.05 wt. % to 0.15 wt. % of 1,2,4-triazole and its derivatives, benzotriazole and its derivatives, 1,2,3-triazole and its derivatives, pyrazole and its derivatives, imidazole and its derivatives, benzoimidazole and its derivatives, benzoimidazole and its derivatives, isocyanurate and its derivatives, and combinations thereof; 0.5 wt. % to 1.5 wt. % of periodic acid, hydrogen peroxide, potassium iodate, potassium permanganate, ammonium persulfate, ammonium molybdate, ferric nitrate, nitric acid, potassium nitrate, and mixtures thereof; and the chemical mechanical polishing (CMP) polishing composition having a pH from 7.0 to about 9.0;

and optionally 0.5 wt. % to 2 wt. % of glycine, picolinic acid, and combinations thereof;

0.0025 wt. % to 0.050 wt. % of ethylene diamine, propylene diamine, organic amine compound containing multi amino groups in the same molecular, and combinations thereof;

0.05 wt. % to 0.15 wt. % of nitric acid, hydrochloric acid, sulfuric acid, phosphoric acid, sodium hydride, potassium hydroxide, ammonium hydroxide, tetraalkylammonium hydroxide, and mixtures thereof;

0.00015 wt. % to 0.0025 wt. % of isothiozilone selected from the group consisting of methylisothiazolinone, methylchloroisothiazolinone, benzisothiazolinone, and combinations thereof; and 0.0025 wt. % to 0.025 wt. % of the surfactant.

19. The chemical mechanical polishing (CMP) system of claim 18, wherein the chemical mechanical polishing (CMP) polishing composition consists essentially of high purity colloidal silica particles; DL-Alanine, ammonium phosphate or potassium phosphate in monobasic, dibasic or tribasic form; 3-amino-1,2,4-triazole, 1,3,5-Tris(2-hydroxyethyl)isocyanurate, or combinations of 3-amino-1,2,4-triazole and 1,3,5-Tris(2-hydroxyethyl)isocyanurate, hydrogen peroxide, and ethylene diamine.

* * * * *